United States Patent [19]
Wang et al.

[11] Patent Number: 5,974,105
[45] Date of Patent: Oct. 26, 1999

[54] HIGH FREQUENCY ALL DIGITAL PHASE-LOCKED LOOP

[75] Inventors: Bor-Min Wang, Taichung; Shu-Fa Yang, Nantou, both of Taiwan

[73] Assignee: Industrial Technology Research Institute, Hsinchu, Taiwan

[21] Appl. No.: 08/816,249

[22] Filed: Mar. 13, 1997

[51] Int. Cl.$^6$ .............................. H03D 3/24; H03L 7/06; H03L 7/00

[52] U.S. Cl. ........................ 375/376; 327/158; 331/1 A

[58] Field of Search .................... 375/327, 371, 375/373, 374, 376; 327/156, 157, 158, 159; 331/1 A, 17, 14

[56] References Cited

U.S. PATENT DOCUMENTS

| | | | |
|---|---|---|---|
| 4,789,996 | 12/1988 | Butcher | 375/376 |
| 5,488,641 | 1/1996 | Ozkan | 375/374 |

OTHER PUBLICATIONS

Loau et al, "PHDPLL for Sonet Desynchronizer", IEEE, 1991.

*Primary Examiner*—Temesghen Ghebretinsae
*Assistant Examiner*—Albert C. Park
*Attorney, Agent, or Firm*—W. Wayne Liauh

[57] ABSTRACT

An improved high-frequency all-digital phase-locked loop for locking a local signal in phase with an input signal is disclosed. It contains a novel digital control oscillator which includes: (a) a delay line comprising L delay gates for generating L clocks, where L is an integer and each of the delay gates has a delay time $\Phi$; (b) a programmable up-down N-counter, where N is an integer; (c) a multiplexer which selects one of the L clocks based on a count of the up-down N-counter programmable; and (d) an adaptive-compensative circuit for determining the value of N based on the following conditions:

$$D(t) = \sum_{k=1}^{N(t)} \phi(k), \qquad (1)$$

$$\pi < D(t) < 2\pi, \qquad (2)$$

and $$D(t) \approx 2\pi. \qquad (3)$$

The adaptive-compensative circuit is implemented with a boolean encoder. This improved design allows all-digital PLL's to be constructed without a high frequency system clock, while, at the same time, maintains excellent stability and generates minimum output jitters.

9 Claims, 4 Drawing Sheets

HIGH FREQUENCY ALL DIGITAL PHASE-LOCKED LOOP

FIELD OF THE INVENTION

The present invention relates to an all-digital phase-locked loop (PLL). More specifically, the present invention relates to an improved high frequency all-digital phase-locked loop, which is capable of minimizing output jitters and providing excellent loop stability over a wide range of operating conditions, but does not require a high frequency system clock and thus can be manufactured at a substantially reduced cost.

BACKGROUND OF THE INVENTION

Many of the discussions on phase-locked loop have been provided in a co-pending application Ser. No. 08/555,941, filed by the same co-inventors, the content thereof is incorporated herein by reference. Basically, a phase-locked loop (PLL) is an electronic circuit for locking an oscillator in phase with an input signal. In other words, a PLL is an electronic circuit for synchronizing, in frequency as well as in phase, an output signal with a reference signal. A PLL can act as a demodulator to demodulate a carrier frequency, or it can be used to track a carrier or synchronizing signal whose frequency varies with respect to time.

PLLs have found a variety of important applications in, for example, communication systems, computers, television engineering, etc. In general, PLLs can be classified, based on its method of implementation, into three main types: analog, mixed digital/analog, and all digital PLLs. A basic analog PLL consists of a phase detector and a low pass filter with a feed back loop closed by a local voltage-controlled oscillator (VCO). The phase detector detects and tracks small differences in phase and frequency between the incoming signal and the VCO signal, and provides output pulses that are proportional to the detected difference. The low-pass filter removes alternating current (ac) components to provide a direct-current (dc) voltage signal to drive the VCO. The input voltage will act to change the output frequency of the VCO to that of the input signal. The phase detector and low-pass filter function as the mixer in a general feedback loop. The output is driven in the direction that will minimize the error signal, such as in frequency. Accordingly, the loop tends to drive the error signal back toward zero frequency. Once the two frequencies are made equal, the output from the VCO will be locked into the input signal, and any phase difference between the two signals will be controlled.

Recently, all-digital PLLs have been developed which provide several advantages over the analog PLLs, including: (1) high yield rate from the IC process; (2) relatively low cost; (3) high stability; (4) can be implemented without external components, such as VCXO, loop filter, etc.; (5) can be implemented with a very narrow loop bandwidth; and (6) can be implemented in a single PLD, thus fostering system development. Some of the most commonly used digital PLLs include SN54LS297 and SN74LS297, both are available from Texas Instrument. The two chips are essentially identical in specification except that the former can operate at a broader temperature range (−55° C. to 125° C.) than the latter (0° C. to 70° C.).

While the all-digital PLLs provide many advantages over their analog counterparts, there is also a very important drawback: they need a substantially higher frequency system clock than the input clock to divide the input clock period into a fractional of the unit interval (UI). The extent to which the system clock must be faster than the input clock depends on the maximum permissible output jitter. For an E1-rated output (2.048 M Hz), if the maximum allowable output jitter is to be controlled below 1/32 UI, the conventional all-digital PLL would need a system clock with a frequency as high as 131.072 M Hz or 65.536 M Hz. The requirement of such a high frequency system clock can substantially increase the design complexity and the cost thereof.

In an article entitled: "PHDPLL for SONET Desynchronizer", by Chii-Min Loau and Ji-Tsu Wu, it is disclosed a phase-hopping digital PLL (PHDPLL) for high-speed desynchronization which provided very narrow bandwidth (below 1 Hz). The PHDPLL included the conventional EXclusive-OR (EXOR or XOR) phase detector and a phase-hopping digitally controlled oscillator (PHDCO). The PHDPLL uses the delay time of a basic gate (e.g., a buffer or an OR gate) to cause a phase hopping and thereby a phase step, and does not require a system clock which is required by a conventional all-digital PLL. However, the gate delay utilized in the PHDPLL is highly susceptible to variations due to fluctuations in the local temperature, manufacturing process, operating voltage, etc. The variation in the gate delay can range from as high as twice as much as the designed value to as low as one-half of the designed value. Such a large variation in the intended gate delay can result in failures in attempting to acquire the lock-in, or generate a large output jitter.

In the co-pending application Ser. No. 08/555,941, it was disclosed an improved all-digital PLL which can reduce the required frequency of the system clock by 75%, thus greatly reducing the production cost of PLLs. However, it still needs a relatively high frequency system clock. The PHDPLL does not require a high frequency system clock; however, its performance has been largely unsatisfactory. As discussed before, the variations in the gate delay times can range from as high as twice the designed value to as low as one-half of the designed value. In order to minimize output jitters, the delay time of each delay gate (assuming all the delay gates have the same delay time), $\Phi$, is designed such that $\Phi L$ is as close to $2\pi$ as possible (but still less than $2\pi$, L is the total number of the gate delays). Under this "optimum" design, a small increase in the gate delay (due to change in temperature, process, and/or voltage) can cause the delay time of $\Phi L$ to be greater than $2\pi$, and the loop will become unstable.

Theoretically, the PHDPLL can be "underdesigned" (i.e., by designing the delay gate such that $\Phi L$ is substantially smaller than $2\pi$) to avoid the above-mentioned instability. However, this would cause large output jitters to be experienced under normal conditions, and is thus highly undesirable. Furthermore, since the gate delay time can be decreased as a result of the changes in environmental variables such as temperature, process, and/or voltage. This factor itself would cause the PHDPLL to be operating away from the optimum condition and result in large output jitters even without an underdesign.

Because of the above mentioned shortcomings, there exist needs to design an improved all-digital PLLs which can be implemented without a high frequency system clock, provide the required stability with minimum output jitter. And most importantly, its stability is independent of temperature, process, voltage and other environmental variations.

SUMMARY OF THE INVENTION

The primary object of the present invention is to develop an improved all-digital phase-locked loop. More specifically, the primary object of the present invention is to develop a high-stability and minimum-output-jitter all-digital phase-locked loop which can be implemented without requiring a high frequency system clock.

In the improved all-digital PLL disclosed in the present invention, a delay line, which is implemented by a chain of delay gates in cooperation with a programmable up-down counter, is provide to generate a plurality of phase-different clocks. The improved all-digital PLL of the present invention comprises three main components: a phase detector (PD), a K-counter, and a digital control oscillator (DCO). The PD is provided to compare the phase of the two incoming signals $\Phi_{in}$ and $\Phi_{out}$. The output signals from the PD depend on the phase error between $\Phi_{in}$ and $\Phi_{out}$. The PD can be constructed from two D-type flip-flops, whose outputs are denoted as "UP" (up) and "DN" (down), respectively. Typically, the outputs of a PD are initialized at "zero states". If the two input signals are exactly in phase, the positive edges of these two input signals will occur at the same time. Hence, their effects are canceled against each other, and the output from the PD will be zero until a different situation is detected. When the two input signals are out of phase, the PD will detect the phase error, which would range from $-2\pi$ to $2\pi$. The output signals "UP" and "DN" from the PD are sent to the K-counter for adjusting the frequency of the loop's output. When the total pulse width of the "UP" signals is greater than that of the "DN" signals, the frequency of the loop's output will be reduced (i.e., slowed down). On the other hand, when the total pulse width of the "UP" signals is smaller than that of the "DN" signals, the frequency of the loop's output will be increased (i.e., sped up). It is to be noted that many other types of phase detectors can be used in the present invention, and the above discussion only provides one of the many examples.

The K-counter operates in cooperation with the DCO to produce a signal which is fed back to the PD. Included in the K-counter are an "up" counter and a "down" counter. The K-counter works as a digital loop filter. A "carry" output (CA) is generated from the up counter, and a "borrow" output (BO) is generated from the down counter. The two output signals, CA and BO, are sent as inputs to the DCO. If the DN output from the PD is active, this enables the down section of the K-counter. When the K-counter is under flow, this will produce a "borrow" pulse. The borrow pulse will force the DCO to select a phase-leading local clock, and the loop's output is "advanced". On the other hand, if the UP output from phase detector PD is active, then this signal will enable the up counter section of the K-counter. When the K-counter is over flow, this will produce a carry pulse. The carry pulse will force the DCO to select a phase-lagging local clock, and the loop's output is "delayed".

In the all-digital phase-locked loop of the present invention, the value of K in the K-counter is an important parameter. If the value of K is too small, then the K-counter will recycle very often, thus generating an undesirably high frequency of carry and/or borrow pulses. This means a high frequency phase hopping of the loop output and a high frequency in the output jitter. On the other hand, if the value of K is too small, the loop's cut-off frequency will be undesirably too low and the lock-in range is small, thus resulting in a prolonged tracking process.

One of the key elements of the present invention is a novel DCO design, which comprises a delay line arranged into L stages (i.e., an L-staged delay line), a programmable up-down N-counter, an adaptive-compensative circuit, and a multiplexer. The delay line, which consists of a chain of gate delays, provides a set of phase-different clocks for the DCO to implement a phase-hopping action. The up-down N-counter accepts the carry and borrow signals from the K-counter and outputs an address to the multiplexer to thereby select a corresponding clock from the set of phase-different clocks, which are provided as outputs from the delay line. In the simplest case, the delay line consists of L gate delays and each gate delay causes a phase delay of $\Phi$, measured under a standard condition (i.e., for design purposes). Each time the carrier pulse forces the multiplexer to select the phase lagging local clock, the loop's output will be delay by phase $\Phi$. Likewise, each time the borrow signal forces the multiplexer to select a phase leading local clock, the loop's output will be advanced by phase $\Phi$. In the present invention, unlike the conventional design, the value of the phase delay $\Phi$ can be designed such it satisfies the following relationship:

$$\Phi L > 2\pi \qquad \text{Eq. (1)}$$

In comparison, in the conventional design, the value of $\Phi$ is designed such that $\Phi L$ must always be less than $2\pi$ in order to ensure stability.

One of the key elements of the present invention is the programmable up-down N-counter and the adaptive-compensative circuit, which calculates a count limit N (for overflow) according to the following coupled equations:

$$D(t) = \sum_{k=1}^{N(t)} \phi(k) \qquad \text{Eq. (2)}$$

$$\pi < D(t) < 2\pi \qquad \text{Eq. (3)}$$

In Eq (2), an additional condition is further imposed such that D(t) is as close to $2\pi$ as possible, to minimum output jitters. This condition is expressed below:

$$D(t) \approx 2\pi \qquad \text{Eq. (4)}$$

The so-calculated count limit N is then output to the up-down N-counter in the DCO to update its N value. It should be noted that both N and D are expressed as a function of time, t, i.e., N(t) and D(t), respectively. This means that the count limit N must be constantly updated. This provision allows the design that $\Phi L$ be greater $2\pi$ while still maintaining a loop stability. With a system running at a system clock of 100 MHz, it may be desirable to update the count limit N every few microseconds.

In the present invention, the count limit N is calculated using an adaptive-compensative circuit. Basically, the adaptive-compensative circuit is designed which first compares the phase difference (with respect to the input, or sample, clock) after each delay gate against $\pi$ and $2\pi$. Suppose the first gate (at time t) at which the total phase difference is greater than $2\pi$ occurs at delay gate I (i.e., P(I-1)<$2\pi$ and P(I)>$2\pi$), then the value I-1 is selected as the new count limit N which will be input to the programmable up-down N-counter of the DCO. The operation of the adaptive-compensative circuit is further illustrated in FIGS. 4a and 4b. FIG. 4a shows the L stages of delay gates from 1, 2, . . . to L. The value of N is a variable to be determined using the adaptive-compensative circuit. FIG. 4b shows a schematic illustration of how the adaptive-compensative circuit operates. First, at time t, a sample clock is used to sample the values from each of the L clocks (i.e., the delay time after each of the L delay gates). The L sampled values X(n) (X(n) is the logical value, i.e., X(n)=1 if true, X(n)=0 if false, of the expression, X(n)=logical ($\pi$<D(n)<$2\pi$), where n=1, 2, . . . , L, and D(n) is the delay time at gate n), are encoded using an encoder circuit to decide the value of N(t). The decoder circuit can be easily implemented using a boolean equation X(n)$\overline{X(n+1)}$, where n=1, 2, . . . , L. The value of N will be selected when X(N)$\overline{X(N+1)}$=1. Using this procedure, the total delay D(t) of the N(t) stages can be kept very close to $2\pi$ at all times thus minimizing output jitters, while ensuring excellent loop stability.

Another way to provide a shorthand description of the present invention is that the conventional designs focuses only on a single value gate delay (designated as $\Phi_s$, indicating "standard" or "nominal" value); whereas, the present invention takes into consideration the minimum gate delay (designated as $\Phi_{min}$) and the maximum gate delay (designated as $\Phi_{max}$). Due to environmental variations, the minimum gate delay can be as low as 50% of the standard value (i.e., $\Phi_{min} \approx 0.5\ \Phi_s$). On the other hand, the maximum gate delay can be as high as 200% of the standard value (i.e., $\Phi_{max} \approx 2.0\ \Phi_s$). In the prior art phase-hopping PLL designs, the textbook design criterion is that the value of $\Phi_s L = 2\pi$. Theoretically, it is possible to reduce output jitters by overdesigning $\Phi_s$ (increasing its value in the design), at the risk of increasing the possibility of loop unstability. It is also possible to improve the loop stability by underdesigning $\Phi_s$ (decreasing its value in the design). However, this is done at the expense of increasing output jitters. With the adaptive-compensative circuit and the programmer up-down N-counter of the present invention, the output jitters are reduced to a minimum, while that loop stability is always maintained. The present invention also removes the inherent instability of the prior art phase-hopping PLL's. It should be noted that the maximum and minimum gate delay variations of 200% and 50% are for illustrative purposes. The present invention can be utilized in situations with more serious variations.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

The present invention discloses an improved all-digital phase-locked loop. The main advantages of the all-digital phase-locked loop disclosed in the present invention are that it can be implemented without a high frequency system clock, while exhibiting minimum output jitters and excellent stability, which, unlike the conventional all-digital phase-locked loops, is independent of temperature, process, voltage and other environmental variations such as the initial state.

Figure 1:
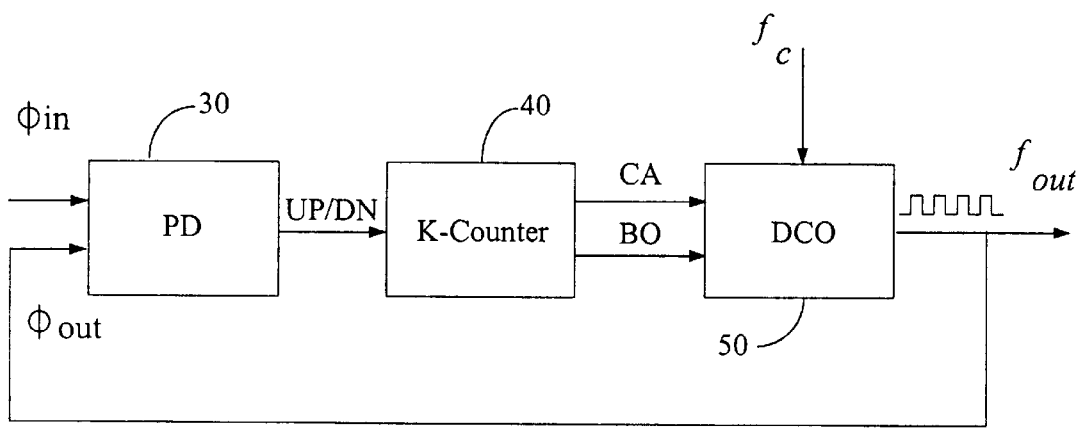
FIG. 1 is a functional block diagram of a preferred embodiment of the improved all-digital phase-locked loop disclosed in the present invention.

FIG. 1 is a functional block diagram of a preferred embodiment of the improved all-digital phase-locked loop 10 disclosed in the present invention. The improved all-digital PLL 10 of the present inventions comprises three main components: a phase detector (PD) 30, a K-counter 40, and a digital control oscillator (DCO) 50. The PD 30 is provided to compare the phases of the two incoming signals $\Phi_{in}$ and $\Phi_{out}$, where $\Phi_{in}$ is the phase of the external clock and $\Phi_{out}$ is the phase of DCO. Both signals $\Phi_{in}$ and $\Phi_{out}$ are considered as input signals to the PD 30. The output signals from the PD 30 (shown as UP/DN) depend on the phase error between the two clocks, when the loop has not yet acquired a lock-in state. The output signal UP or DN is input to the K-counter to indicate the counting direction of K-count and determine the frequency of the loop output. For example, when the total pulse width of signal UP is greater than that of signal DN, the K-count will count up and the frequency of the loop output will be slowed down accordingly. On the other hand, when the total pulse width of signal UP is smaller than that of signal DN, the K-count will count down and the frequency of the loop output will be sped up accordingly.

The PD 30 can be constructed as consisting of two D-type flip-flops, whose outputs are denoted as "UP" (up) and "DN" (down), respectively. The input signal and the output signal are connected to the "CK" input port of the two flip-flops, respectively, and their "D" input ports are connected to Vcc. Typically, both outputs of the PFD are initialized at zero states. If the two input signals to be compared by the PD 20 (i.e., $\Phi_{in}$ and $\Phi_{out}$) are exactly in phase, then the positive edges of these two input signals will occur at the same time. Hence, their effects are canceled against each other, and the output from the PD 20 will be zero until a difference between the $\Phi_{in}$ and $\Phi_{out}$ is detected. When the two input signals $\Phi_{in}$ and $\Phi_{out}$ are out of phase, then the PD 20 will detect the phase error, which would range from $-2\pi$ to $2\pi$.

The output signals "UP" and "DN" from the PD 20 are sent to the K-counter 40, which operates in conjunction with the digital control oscillator (DCO) 50 to produce a signal which is fed back to the phase detector. The K-counter 40 includes an up-counter and a down-counter, and it works as a digital loop filter. The up-counter comprises a carry output (CA), and the down-counter comprises a borrow output (BO). These two output signals are input to the DCO. If the DN output of the PD is active, this enables the down counter section of the K-counter. Eventually, when the K-counter is underflow, a borrow pulse is produced. The borrow pulse forces the DCO to select a phase-leading local clock, and the loop output is advanced. On the other hand, if the UP output of the PD is active, this enables the up-counter section of the K-counter. Eventually, when the K-counter is overflow, a carry pulse is produced. The carry pulse forces the DCO to select a phase-lagging local clock, and the loop output is delayed.

The value of K in the K-counter 40 is an important parameter. If the value of K is too small, then the K-counter 40 will recycle very often, thus generating a high frequency of carry and/or borrow pulses. This means a high frequency phase hopping of the loop output and a high frequency output jitter. On the other hand, if the value of K is too large, the loop's cut-off frequency will be too low and the lock-in range is too small, thus resulting in a prolonged tracking process.

Figure 2A:
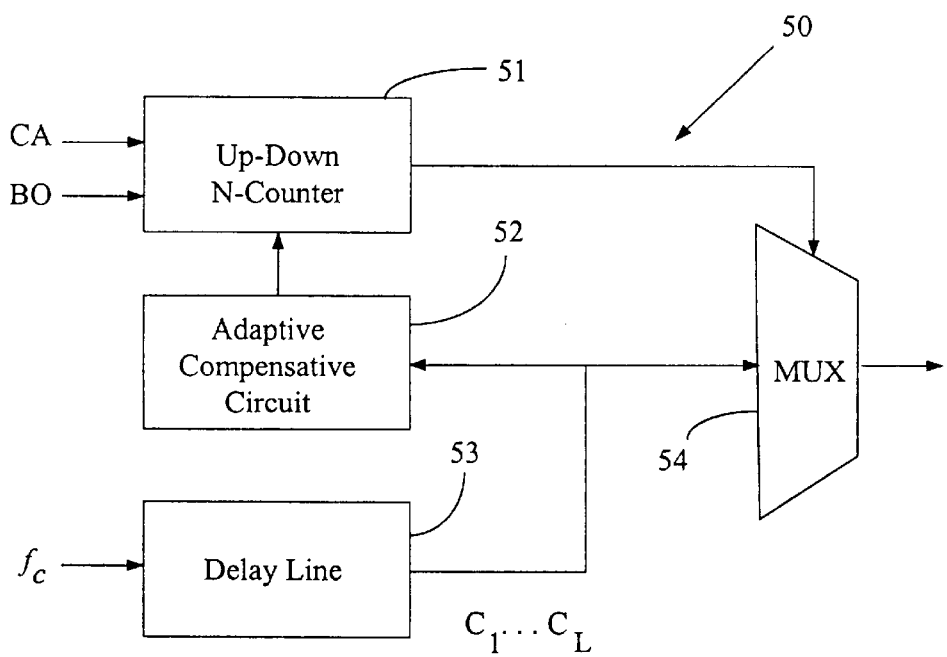
FIG. 2a is a functional block diagram of a preferred embodiment of the digital control oscillator (DCO) for use in the improved all-digital phase-locked loop as shown in FIG. 1.
Figure 2B:
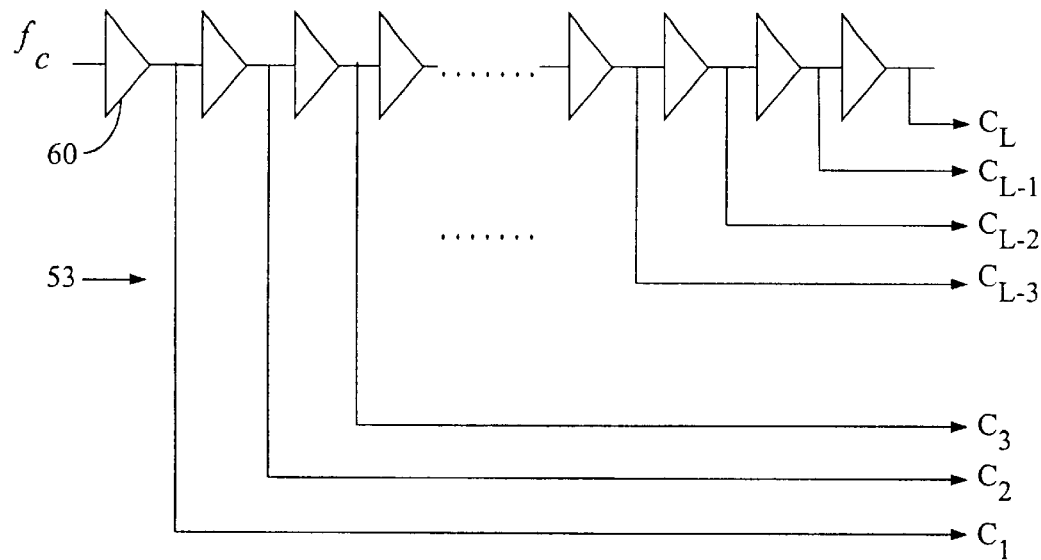
FIG. 2b is a functional diagram showing a delay line which generates L phase-different clocks, from $C_1, C_2, \ldots, C_{L-2}, C_{L-1}$, and $C_L$.
Figure 2C:
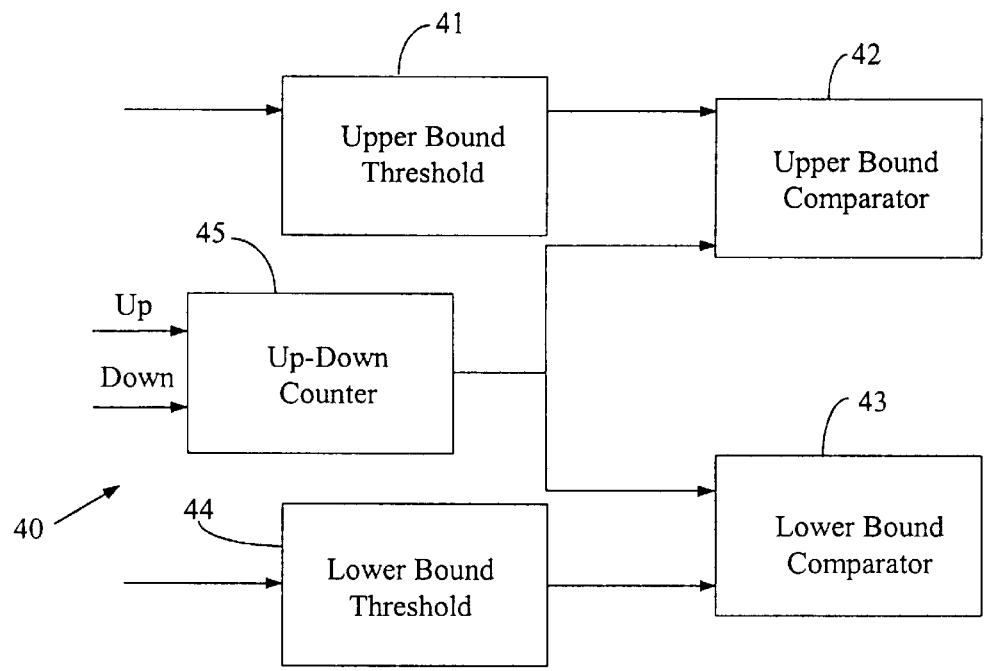
FIG. 2c is a functional block diagram showing the construction of the K-counter.
Figure 3:
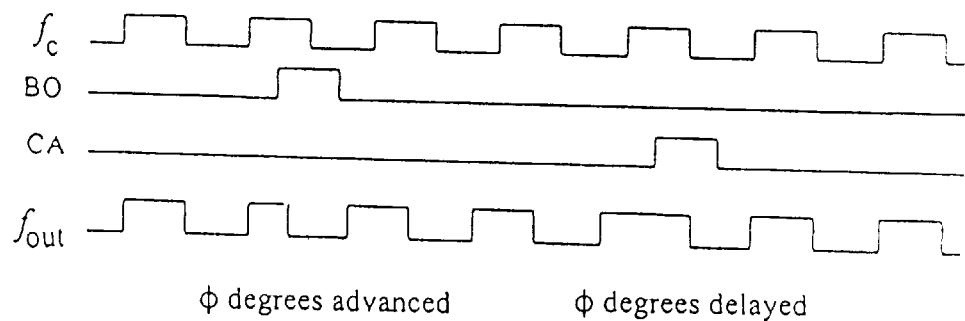
FIG. 3 is a schematic diagram showing the phase hopping mechanism implemented by the digital control oscillator (DCO) as shown in FIG. 2.

One of the key elements of the present invention is the implementation of a novel DCO. FIG. 2 shows a functional block diagram of a preferred embodiment of the digital control oscillator (DCO) of the present invention for use in the improved all-digital phase-locked loop as shown in FIG. 1. FIG. 3 is a schematic diagram showing the phase hopping mechanism implemented by the digital control oscillator (DCO) as shown in FIGS. 2a and 2b. As shown in FIG. 2a, the DCO 50 consists of an up-down N-counter 51, an adaptive-compensative circuit 52, a delay line with L stages (i.e., L delay gates) 53, and a multiplexer 54. FIG. 2b shows that the delay line 53 generates L phase-different clocks, from $C_1, C_2, \ldots, C_{L-2}, C_{L-1}$, and $C_L$, to support the phase hopping action performed by the DCO. The up-down N-counter 51 accepts the carry and borrow signals from the K-counter, and outputs an address to the multiplexer 54 to select a correponding clock from the delay line 53. In a preferred embodiment of the present invention, all the delay gates have the same phase delay $\Phi$ (which, however, will be a time-dependent variable). FIG. 2c is a functional block diagram showing the construction of the K-counter 40, which comprises an upper bound threshold 41, an upper bound comparator 42, a lower bound threshold 44, a lower bound comparator 43, and an up-down counter 45. Since these components are known in the art; they will not be discussed here.

When the carry pulse forces the multiplexer to select a phase lagging local clock, the loop output will be delayed by $\Phi$ degrees. When the borrow pulse forces the multiplexer to select a phase leading local clock, the loop output will be advanced by $\Phi$ degrees. Because the up-count N-counter counts cyclically, the L clocks will be selected by the multiplexer, in conjunction with the up-down counter, on a cyclic basis as well. With a fixed N-counter (where N=L), to ensure stability, the delay chain must be designed such that:

$$\pi < \Phi L < 2\pi \qquad \text{Eq. (5)}$$

On the other hand, in order to minimize output jitters, the delay chain must be also designed such that:

$$\Phi L \approx 2\pi \qquad \text{Eq. (6)}$$

In theory, these two criteria, Eqs. (5) and (6), are not in conflict. However, in actual practice, because of variations in the temperature, voltage, IC-manufacturing process, etc, the gate delay $\Phi$ typically varies between a minimum gate delay, $\Phi_{min}$, and a maximum gate delay, $\Phi_{max}$. Typically, the minimum gate delay can be as low as 50% of the standard value (i.e., $\Phi_{min} \approx 0.5 \Phi_s$, $\Phi_s$ being the "standard" or "nominal" gate delay time under design conditions), and the maximum gate delay can be as high as 200% of the standard value (i.e., $\Phi_{max} \approx 2.0 \Phi_s$). These variations often cause the phase-hopping PLL's to be unstable. As discussed above, the textbook design criterion is that the value of $\Phi_s$ should be that $\Phi_s L \approx 2\pi$. Theoretically, it seems possible to improve the loop stability by underdesigning $\Phi_s$ (I.e., decreasing gate delay). However, this will often result in unacceptable output jitters ("out of spec"). It is also possible to reduce output jitters by overdesigning $\Phi_s$ (i.e., increasing the gate delay). However, this is done at the risk of adversely affecting the loop stability. Because of these inherent problems, the phase-hopping PLL's have been largely considered impractical.

In the present invention, instead of using a constant-stage delay change, a variable-stage delay chain is used in the DCO. In other words, the total delay stages (to be cycled) of the delay chain is made, in the present invention, a function of time, via an adaptive-compensative circuit and a programmer up-down N-counter, so as to adaptively compensate the changes in the environmental variables such as temperature, process, voltage, etc., that may affect the gate delay times.

Figure 4A:
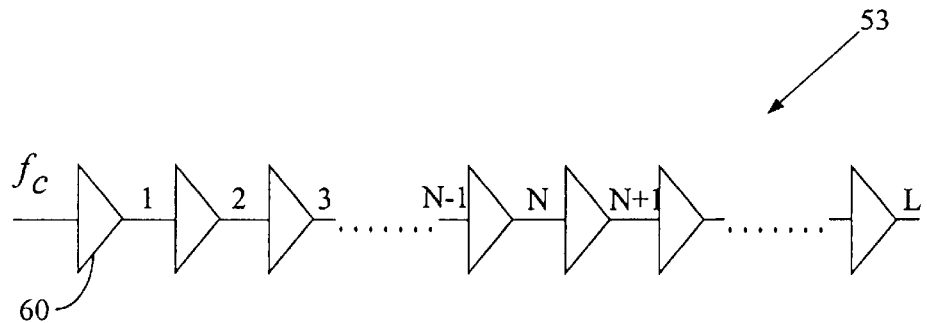
FIG. 4a is a schematic diagram showing the L stages of delay gates from 1, 2, . . . to L; the value of N is a variable to be determined using the adaptive-compensative circuit.
Figure 4B:
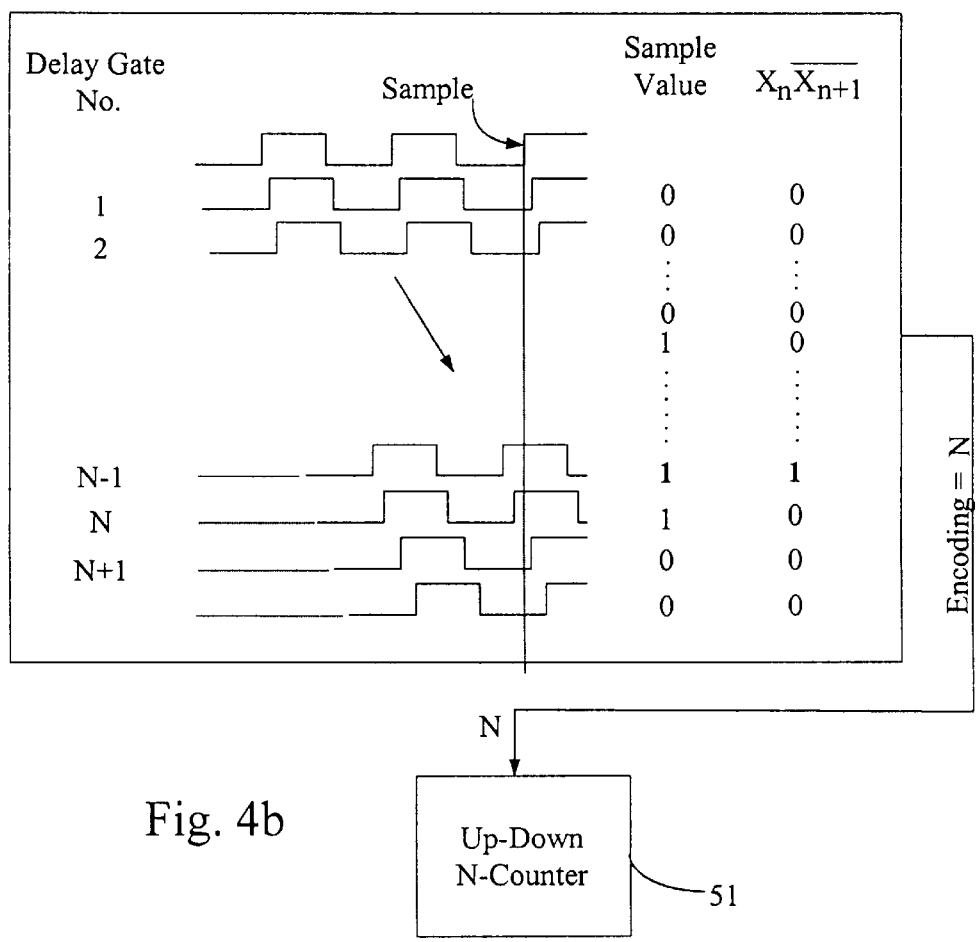
FIG. 4b is a schematic illustration of the adaptive-compensative circuit according to a preferred embodiment of the present invention for determining the value of N.

FIG. 4a is a schematic diagram showing the L stages of delay gates from 1, 2, ... to L; the value of N is a variable to be determined using the adaptive-compensative circuit. FIG. 4b is a schematic illustration of the adaptive-compensative circuit according to a preferred embodiment of the present invention.

The adaptive-compensative circuit calculates a time-dependent count limit N (for overflow) according to the following three coupled equations, Eqs (2)–(4):

$$D(t) = \sum_{k=1}^{N(t)} \phi(k) \qquad \text{Eq. (2)}$$

$$\pi < D(t) < 2\pi \qquad \text{Eq. (3)}$$

$$D(t) \approx 2\pi \qquad \text{Eq. (4)}$$

The calculated count limit N is then input to the programmable up-down counter in the DCO. It should be noted that both N and D are expressed as a function of time, t, i.e., N(t) and D(t), respectively. This means that the count limit N must be constantly updated. In a example system which runs at a system clock of 100 MHz, it was determined that it was satisfactory to update the count limit N every microseconds. However, the frequency at which the count limit N is updated depends on the degree of fluctuation of the environmental variables. If the environmental variables fluctuate rapidly, then a higher frequency of update may be required. Conversely, a slower frequency of update may be satisfactory.

The adaptive-compensative circuit is designed such that it first compares the phase delay (with respect to the input, or sample, clock) after each delay gate against $\pi$ and $2\pi$, to obtain a series of sampled values X(n), where n=1, 2, ... L, and X(n)=logical ($\pi$<D(n)<$2\pi$). The value I will be selected and input to the programmable up-down N-counter as the count limit N, when the phase delay D(I) is less than $2\pi$, but the immediately next delay time D(I+1) is greater than $2\pi$ (i.e., D(I)<$2\pi$ and D(I+1)>$2\pi$). In FIG. 4a it is shown the L stages of delay gates from 1, 2, ... to L. The operation of the adaptive-compensative circuit as shown in FIG. 4b can be illustrated in more detail as follows.

First, at time t, a system clock is used to sample the values from each of the L clocks (i.e., after each of the L delay gates). The L sampled values, X(n)(=logical ($\pi$<D(n)<$2\pi$), where n=1, 2, ..., L), are decoded using a decoder circuit to decide the value of N(t). The decoder circuit can be easily implemented using a boolean equation X(n)$\overline{X(n+1)}$, where n=1, 2, ..., L. The value of N will be selected when X(N)$\overline{X(N+1)}$=1. Using this procedure, the total delay D(t) of the N(t) stages (i.e., after gate N) relative to the system clock can be kept very close to $2\pi$ at all times thus minimizing output jitters, while ensuring excellent stability.

One of the main differences between the present invention and the previous phase-hopping PLL's is that in the present invention, the total delays of the L stages is typically designed to be greater than $2\pi$, i.e.:

Present invention: $\Phi L > 2\pi$      Eq. (1)

On contrast, the previous phase-hopping PLL's require that total delays of the L stages be smaller than $2\pi$, i.e.:

Prior art devices: $\pi < \Phi L < 2\pi$      Eq. (5)

As shown in FIG. 4b, the encoder only requires a boolean function, $X(n)\overline{X(n+1)}$, for implementation. $X_n$ (i.e., X(n)) and $X_{n+1}$ (i.e., X(n+1)) represent the sampled values of the nth and (n+1)th clocks, respectively, ($\overline{X(n+1)}$ is the inverse of X(n+1), n=1, ..., L). As shown in FIG. 4b, X(1), X(2), ... =0 (because D(1), D(2), ... <$\pi$), and the corresponding boolean functions are also 0. FIG. 4b also shows that, somewhere between clock 2 and clock (N-1), the value of X(n) becomes one, but their boolean functions still remain zero (because the inverse of X(n+1) is zero). Finally the Nth clock is reached wherein it boolean function is one (i.e., X(N)=1 and X(N+1)=0). After the Nth delay gate, since all the X(n)'s (where n>N) are zero, their boolean functions are zero, also. The value of N so obtained is input to the programmable up-down counter of the DCO. During up-counting, the counting sequence is:

0, 1, 2, 3, ..., N-2, N-1, 0, 1, 2, 3, 4, ..., N-2, N-1, 0, ...

And during the down-counting, the counting sequence will be:

N-1, N-2, ..., 3, 2, 1, 0, N-1, N-2, ..., 3, 2, 1, 0, N-1, ...

With the adaptive-compensative circuit and the programmer up-down N-counter of the present invention, since the total delay D(t) is maintained to be the closest to $2\pi$, the output jitters are reduced to a minimum. The boolean encoder also ensures that loop stability is maintained.

The improved high frequency all-digital phase-locked loop disclosed in the present invention was constructed using a 0.6 $\mu$m standard cell fabricated at the Computer and Communication Laboratories, of the Industrial Technology Research Institute of Taiwan. The delay gate had a $\Phi_{min} \approx 0.5$ $\Phi_s$), and the maximum delay time would be 0.24 ns (i.e., $\Phi_{max} \approx 2.0$ $\Phi_s$). The allowed maximum output jitter was 0.0625 UI. Under this specification, the maximum output clock frequency in the worse case was calculated to be:

worse case maximum output clock frequency =

$$\frac{1}{0.24 \text{ ns} \times 32} = \frac{1}{7.68 \text{ ns}} = 130 \text{ MHz}$$

Test results showed that the high frequency all digital PLL of the present invention can provide an output clock with a frequency higher than 100 MHz, and the output jitter was below 0.0625 UI. This loop can maintain excellent stability and excellent clock quality (low output jitter and wander) at operating temperatures ranging from from $-40°$ C. to $85°$ C., and voltages from 4.5 volt to 5.5 volt.

Figure 5A:
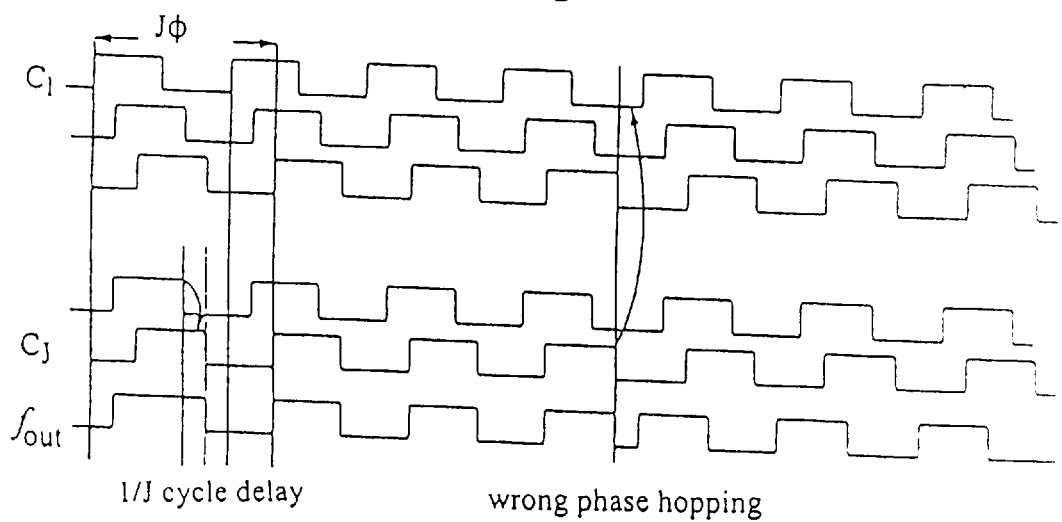
FIG. 5a is a schematic timing diagram showing the effect of total gate delay being greater than $2\pi$, resulting in loop instability.
Figure 5B:
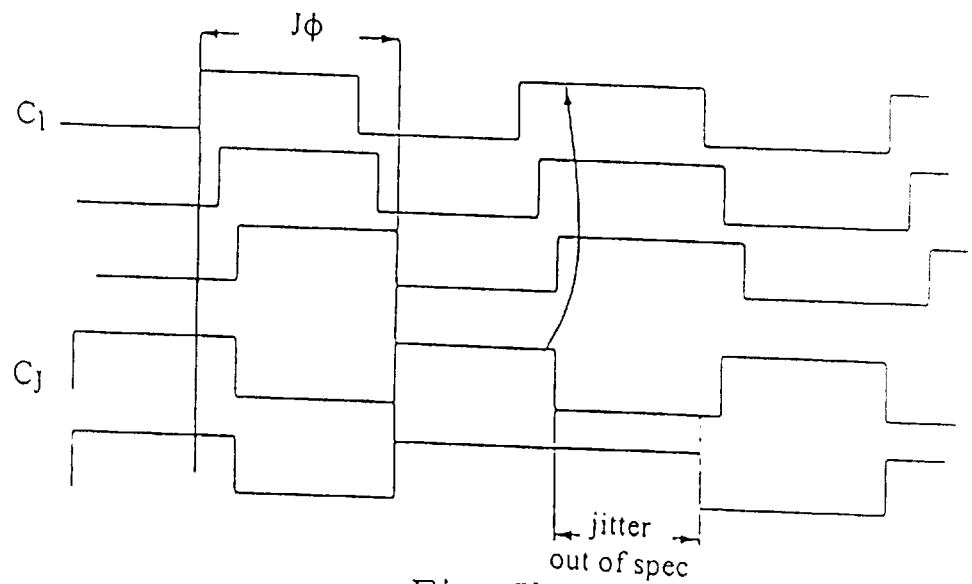
FIG. 5b is a schematic timing diagram showing the effect of total gate delay being substantially smaller than $2\pi$, resulting in large, out of spec, output jitter.

As discussed earlier, the conventional all-digital PLL's require a high frequency clock. This makes the all-digital PLL's expensive, especially when the frequency of output clock continues to increase. The phase-hopping PLL's do not require a high frequency clock. However, because of the variations in the gate delay, due to environmental variables such as temperature, process, voltage, etc., the phase-hopping PLL's are either unstable or will generate very large output jitters. FIG. 5a is a schematic timing diagram show-ing the effect of gate delay being greater than $2\pi$, resulting in loop instability. FIG. 5b is a schematic timing diagram showing the effect of gate delay being smaller than $2\pi$, resulting in large, out of spec, output jitter. The novel design of the present invention allows the all-digital PLL's to be constructed without a high frequency system clock, while, at the same time, maintains excellent stability and generates minimum output jitters.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A high-frequency all-digital phase-locked loop for locking a local signal in phase with an input signal comprising:

(a) a digital control oscillator for receiving said local signal and generating said an output signal;

(b) a K-counter for providing first control signals to said digital control oscillator;

(c) a phase detector for receiving and comparing said output signal and said input signal and providing second control signals to said K-counter according to a detected phase difference between said input and output signals;

(d) wherein said digital control oscillator comprises:

(i) a delay line comprising L delay gates for generating L clocks, where L is an integer and each of said delay gates has a delay time $\Phi$;

(ii) a programmable updown N-counter, where N is an integer;

(iii) a multiplexer which selects one of said L clocks based on a count of said programmable up-down N-counter; and (iv) an adaptive-compensative circuit for determining the value of N based on the following conditions:

$$D(t) = \sum_{k=1}^{N(t)} \phi(k),$$

$$\pi < D(t) < 2\pi,$$

and $$D(t) \approx 2\pi$$

where t indicates a specific time;
further wherein said adaptive-compensative circuit includes a boolean encoder and is constructed to perform the following functions:

(i) at time t, using a system clock to sample the values from each of said L clocks, designated as X(n), where n=1, 2, ... L;

(ii) setting X(n) to be 1 if ($\pi$<D(n)<2$\pi$), where D(n) is the phase delay for clock no; otherwise, X(n)=0;

(iii) calculating X(n)$\overline{X(n+1)}$ for each n, where $\overline{X(n+1)}$ is the inverse of X(n+1), (iv) determining the value of N based on the value of the boolean function such that X(N)$\overline{X(N+1)}$=1.

2. The high-frequency all-digital phase-locked loop for locking a local signal in phase with an input signal according to claim 1 which is constructed to operated in conditions wherein the delay time of said gate delay can be decreased to about 50% of its designed value.

3. The high-frequency all-digital phase-locked loop for locking a local signal in phase with an input signal according to claim 1 which is constructed to operated in conditions wherein the delay time of said gate delay can be increased to about 200% of its designed value.

4. The high-frequency all-digital phase-locked loop for locking a local signal in phase with an input signal according to claim 1 wherein said input signal has a frequency of at least 100 Mz.

5. A digital control oscillator comprising:

(i) a delay line comprising L delay gates for generating L clocks, where L is an integer and each of said delay gates has a delay time $\Phi$;

(ii) a programmable up-down N-counter, where N is an integer;

(iii) a multiplexer which selects one of said L clocks based on a count of said up-down N-counter programmable; and (iv) an adaptive-compensative circuit for determining the value of N based on the following conditions:

$$D(t) = \sum_{k=1}^{N(t)} \phi(k),$$

$$\pi < D(t) < 2\pi,$$

and $$D(t) \approx 2\pi$$

where t indicates a specific time;

further wherein said adaptive compensative circuit includes a boolean encoder and is constructed to perform the following functions:

(a) at time t, using a system clock to sample the values from each of said L clocks, designated as X(n), where n=1, 2, . . . L;

(b) setting X(n) to be 1 if ($\pi$<D(n)<2$\pi$), where D(n) is the phase delay for clock n; otherwise, X(n)=0;

(c) calculating X(n)$\overline{X(n+1)}$ for each n, where $\overline{X(n+1)}$ is the inverse of X(n+1);

(d) determining the value of N based on the boolean function that X(N)$\overline{X(N+1)}$=1.

6. The digital control oscillator according to claim 5 which is constructed to operated in conditions wherein the delay time of said gate delay can be decreased to about 50% of its designed value.

7. The digital control oscillator according to claim 5 which is constructed to operated in conditions wherein the delay time of said gate delay can be increased to about 200% of its designed value.

8. The digital control oscillator according to claim 5 which is constructed to operated wherein the delay time of said gate delay can vary from about 50% to about 200% of its designed value.

9. The digital control oscillator according to claim 5 which is constructed to operate with an input clock which has a frequency of at least 100 Mz.

* * * * *